(12) United States Patent
Roth et al.

(10) Patent No.: US 8,119,327 B2
(45) Date of Patent: Feb. 21, 2012

(54) POLYMERISABLE COMPOSITION

(75) Inventors: Martin Roth, Hölstein (CH); Bernhard Sailer, Basel (CH); Catherine Schoenenberger, Rantzwiller (FR); Ottilie Zelenko, Oberwil (CH)

(73) Assignee: Huntsman Advanced Materials Americas LLC, The Woodlands, TX (US)

( * ) Notice: Subject to any disclaimer, the term of this patent is extended or adjusted under 35 U.S.C. 154(b) by 636 days.

(21) Appl. No.: 10/509,319

(22) PCT Filed: Mar. 21, 2003

(86) PCT No.: PCT/EP03/50077
§ 371 (c)(1),
(2), (4) Date: Sep. 27, 2004

(87) PCT Pub. No.: WO03/082937
PCT Pub. Date: Oct. 9, 2003

(65) Prior Publication Data
US 2005/0170094 A1 Aug. 4, 2005

(30) Foreign Application Priority Data
Mar. 28, 2002 (CH) ........................ 0537/02

(51) Int. Cl.
*G03F 7/00* (2006.01)
*C08F 24/00* (2006.01)
*B28B 27/08* (2006.01)

(52) U.S. Cl. ............... 430/280.1; 430/281.1; 430/286.1; 526/273; 526/347; 428/520

(58) Field of Classification Search .................. 428/520; 526/273, 347; 430/280.1, 281.1, 286.1
See application file for complete search history.

(56) References Cited

U.S. PATENT DOCUMENTS

| 4,361,640 | A | | 11/1982 | Pine ............................. 430/275 |
| 4,722,947 | A | * | 2/1988 | Thanawalla et al. .......... 522/120 |
| 4,806,450 | A | * | 2/1989 | Hofmann et al. .......... 430/281.1 |
| 4,925,768 | A | | 5/1990 | Iwasaki et al. ................ 430/271 |
| 4,927,884 | A | | 5/1990 | Iwasawa et al. .............. 525/195 |
| 5,296,334 | A | | 3/1994 | Castaldi et al. .............. 430/280 |
| 5,738,916 | A | | 4/1998 | Noguchi et al. .............. 427/511 |
| 5,753,362 | A | * | 5/1998 | Kawase et al. ................ 428/327 |
| 5,800,952 | A | * | 9/1998 | Urano et al. ....................... 430/7 |
| 5,925,484 | A | | 7/1999 | Shima et al. ....................... 430/7 |
| 6,040,002 | A | | 3/2000 | Noguchi et al. ................ 427/96 |
| 6,166,245 | A | | 12/2000 | Lundy et al. .................. 560/209 |
| 6,605,669 | B2 | * | 8/2003 | Awokola et al. .............. 525/123 |

FOREIGN PATENT DOCUMENTS

| EP | 0 114 982 A2 | 8/1984 |
| EP | 0 133 908 A2 | 3/1985 |
| EP | 0 288 865 | 11/1988 |
| EP | 0 288 865 A2 | 11/1988 |
| EP | 0 468 289 | 1/1992 |
| EP | 0 468 289 A2 | 1/1992 |
| JP | 10097067 | 4/1998 |
| JP | 10126038 A | 5/1998 |
| JP | 10152536 A | 6/1998 |
| JP | 2000034319 A | 2/2000 |
| JP | 2005341521 A | 12/2005 |
| WO | WO 01/13175 A2 | 2/2001 |
| WO | WO 02/01929 A2 | 1/2002 |

OTHER PUBLICATIONS

Japanese Office Action dated Sep. 30, 2008 (5 pages).

* cited by examiner

*Primary Examiner* — Kevin R. Kruer

(57) ABSTRACT

The present invention relates to functionalized acrylate polymers, a process for their preparation, photopolymerizable compositions comprising these polymers and the use of the compositions, especially in the production of electronic components. The functionalized acrylate polymers are reaction products comprising at least a) acrylic acid or methacrylic acid or a mixture of acrylic and methacrylic acid and b) a (meth)acrylic ester of substituted or unsubstituted phenol, $C_1$-$C_8$ hydroxyalkylbenzene or $C_1$-$C_8$ hydroxyalkoxybenzene and methyl(meth)acrylate in a molar ratio of from 5:95 to 100:0. 5-90% of the acrylic or methacrylic acid units having reacted with a glycidylvinyl compound.

15 Claims, No Drawings

POLYMERISABLE COMPOSITION

This application is a U.S. National Stage application filed under 35 U.S.C. 371 of International application number PCT/EP03/50077 filed Mar. 21, 2003, which claims priority to Swiss application number 0537/02, filed Mar. 28, 2002.

The present invention relates to functionalized acrylate polymers, a process for their preparation, photopolymerizable compositions comprising these polymers, and the use of the compositions especially in the production of electronic components. The term electronic components is understood as meaning components which are used in electronics, such as, for example, circuit boards or optoelectronic components.

Photopolymerizable compositions, for example for use as a photoresist, such as, for example, as an etch resist for structuring any desired metal surface or as a solder resist for coating structured metal surfaces, have long been known. Furthermore, photopolymerizable compositions are used in laser direct imaging (LDI), in microelectronics, in thin film transistor (TFT) and liquid crystal display (LCD) technology, in the production of printing plates and as ink in inkjet processes.

Nonphotosensitive acrylate polymers, which are used as binder polymers in photopolymerizable compositions, are known, as described in U.S. Pat. No. 4,361,640 and U.S. Pat. No. 4,925,768. Photosensitive acrylate polymers are polymers which contain photoreactive double bonds.

Photosensitive polymers, too, are used as binder polymers in photopolymerizable compositions, as in U.S. Pat. No. 5,296,334. However, compared with (meth)acrylate-containing functionalized polymers, there is a reservation with regard to their suitability in primary or etch resist formulations, as explained in more detail in U.S. Pat. No. 6,166,245, column 1, lines 42-55.

The photopolymerizable compositions known from the prior art are not capable of meeting all requirements set for them. There is therefore a need for improved compositions.

For the use of photopolymerizable compositions as photoresist, in particular an improvement in the photosensitivity, the surface hardness, the strippability, the cold flow behavior and the stackability of coated and dried substrates is desirable.

It was the object of the invention to provide compositions which meet these requirements.

Surprisingly, the photopolymerizable compositions according to the invention have great hardness after drying in combination with high photosensitivity. The great hardness of the coating after drying has a positive effect on the cold flow behavior and on the defect rate caused by mechanical damage. The photoreactive binder polymers increase the photo-sensitivity of the photosensitive compositions, which, after crosslinking or curing, have greater hardness, with constant flexibility, than the corresponding compositions comprising nonfunctionalized binder polymers. In spite of the high photosensitivity, the photosensitive compositions have excellent strippability. The high photosensitivity of the compositions according to the invention permits a reduction in the amount of photoinitiator and hence more economical preparation. The photoresist compositions according to the invention are moreover characterized by a very good shelf life.

The invention therefore provides a reaction product comprising at least a) acrylic acid or methacrylic acid or a mixture of acrylic or methacrylic acid and b) a (meth)acrylic ester of substituted or unsubstituted phenol, $C_1$-$C_8$-hydroxyalkylbenzene or $C_1$-$C_8$-hydroxyalkoxybenzene and methyl(meth)acrylate in the molar ratio of from 5:95 to 100:0, 5-90% and preferably 15-70% of the acrylic or methacrylic acid units having reacted with a glycidylvinyl compound.

Furthermore, unless expressly determined otherwise, acrylic acid and acrylate are always also to be understood as meaning methacrylic acid and methacrylate, respectively, or mixtures thereof.

The reaction products according to the invention correspond to acrylate polymers comprising a structural element of the general formula (I)

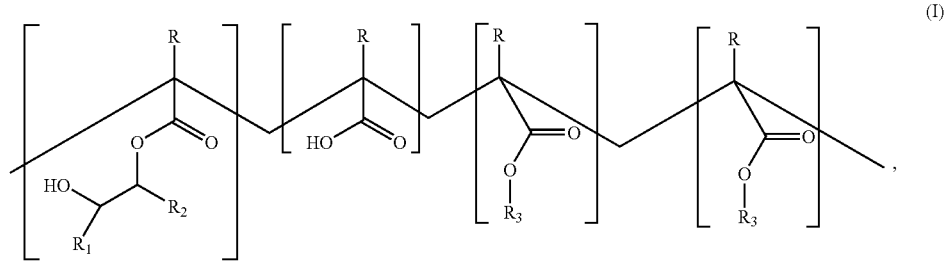

in which R, independently of one another, are H or $CH_3$;

$R_1$ is an organic radical substituted by a vinyl group;

$R_2$ is hydrogen or, together with $R_1$ and including the ethylene group linking $R_1$ and $R_2$, is a six- to eight-membered carbon ring which carries an organic radical substituted by a vinyl group; and $R_3$, independently of one another, are methyl, substituted or unsubstituted phenyl, substituted or unsubstituted $C_1$-$C_8$-alkylphenyl, substituted or unsubstituted $C_1$-$C_8$-alkoxyphenyl or substituted or unsubstituted cycloalkyl, such as $C_5$-$C_8$-cycloalkyl, with the proviso that, at least for one monomer unit, $R_3$ differs from methyl.

The sequence of the monomer units is indicated by way of example in the general formula (I) and is determined by the preparation process and the chosen molar ratios.

The glycidylvinyl compounds used according to the invention each have an epoxide radical and a vinyl radical, an acrylate radical being preferred as the vinyl radical. Examples of such glycidylvinyl compounds are also to be found, inter alia, in U.S. Pat. No. 4,927,884, column 12, line 19 et seq. Thus, $R_1$ as the organic radical substituted by a vinyl group is, for example, an aliphatic, alicyclic or aromatic radical substituted by a vinyl group. $R_1$ as the aliphatic, alicyclic or aromatic radical can be, for example, substituted or unsubstituted alkylene, such as $C_1$-$C_8$-alkylene, substituted or unsubstituted cycloalkylene, such as $C_5$-$C_8$-cycloalklylene, substituted or unsubstituted arylene, such as phenylene or naphthylene, or substituted or unsubstituted alkenylene, such as $C_2$-$C_8$-alkenylene.

Suitable substituents for the radicals mentioned for $R_1$ and $R_3$ are, for example, hydroxyl groups, $C_1$-$C_3$-alkyl groups and $C_1$-$C_8$-alkoxy groups.

$R_1$ is preferably an unsubstituted aliphatic, alicyclic or aromatic radical, $C_1$-$C_8$-alkylene being preferred and —$CH_2$— being particularly preferred.

Preferred reaction products according to the invention correspond to acrylate polymers comprising a structural unit of the general formula (Ia)

The reaction product according to formula (I) preferably has an acid number of 0.4-5.0 mol/kg and particularly preferably 0.8-2.8 mol/kg, referred to the solid resin.

The preparation of such reaction products is in principle known and is described, for example, in (J. M. G. Cowie, Chemie und Physik der synthetischen Polymeren [Chemistry and physics of synthetic polymers], 1997, published by Friedr. Vieweg&Sohn). The polymerization step for the synthesis of the linear acrylate polymer, for example carried out as a solution polymerization, is followed by the glycidylation of some of the free acid groups with a glycidylvinyl compound. Preferred embodiments are indicated in the examples.

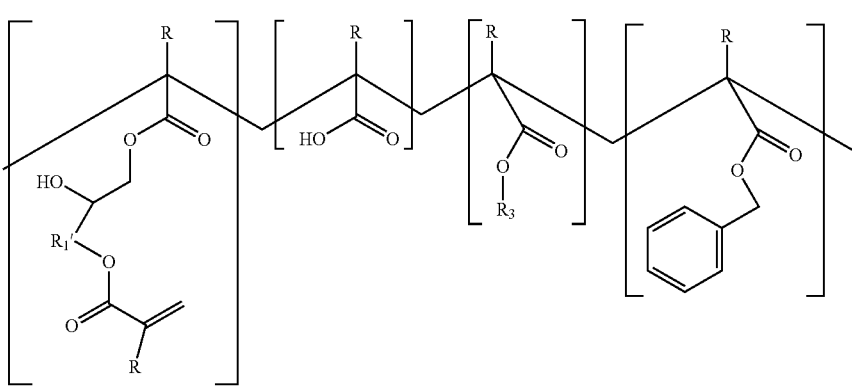

(Ia)

in which R, independently of one another, are H or $CH_3$; $R_1'$ is substituted or unsubstituted $C_1$-$C_8$-alkylene; and $R_3$ is methyl, substituted or unsubstituted phenyl, substituted or unsubstituted $C_1$-$C_8$-alkylphenyl, substituted or unsubstituted $C_1$-$C_8$-alkoxyphenyl or substituted or unsubstituted cycloalkyl, such as $C_5$-$C_8$-cycloalkyl.

A reaction product according to the invention where component a) is methacrylic acid is preferred.

A reaction product according to the invention where the methacrylic ester of component b) is benzyl methacrylate is preferred.

A reaction product according to the invention where the glycidylvinyl compound is glycidyl methacrylate is preferred.

A reaction product according to the invention where component a) is methacrylic acid and the functionalization is effected with glycidyl methacrylate is preferred.

Particularly if increased hardness after drying is desired, a ratio (percent by weight) of a (meth)acrylic ester of substituted or unsubstituted phenol, $C_1$-$C_3$-hydroxyalkylbenzene or $C_1$-$C_8$-hydroxyalkoxybenzene to methyl methacrylate of from 7.1:92.9 to 50:50 is preferred for component b).

Furthermore preferred is a reaction product according to formula (I) where the ratio (percent by weight) of component a) to component b) is from 80:20 to 20:80, a ratio of 40:60 being preferred and a ratio of 30:70 being particularly preferred.

The molecular weight of the reaction product according to formula (I) is preferably 3 000-120 000 g/mol, particularly preferably 8 000-90 000 g/mol.

Apart from the acrylate compounds mentioned for a) and b), the following acrylate monomers can additionally be used for the preparation of the reaction product according to the invention: allyl acrylate allyl methacrylate, methyl, ethyl, n-propyl, n-butyl, isobutyl, n-hexyl, 2-ethylhexyl, n-octyl, n-decyl and n-dodecyl acrylate and methacrylate, 2-hydroxyethyl and 2- and 3-hydroxypropyl acrylate and methacrylate, methacryloyloxy-2-hydroxypropyl methacrylate, 2-methoxyethyl, 2-ethoxyethyl and 2- or 3-ethoxypropyl acrylate, 2-(2-ethoxyethoxy)ethyl acrylate, tetrahydrofurfuryl methacrylate, cyclohexyl methacrylate, phenyl methacrylate, phenylethyl methacrylate, toluyl methacrylate, tolylethyl methacrylate, 2-phenoxyethyl methacrylate, 2-tolyloxyethyl methacrylate, isodecyl methacrylate and isobornyl methacrylate. Such products are likewise known and some of them are commercially available, for example from SARTOMER Company (USA).

The following are particularly preferred as additional acrylate monomers, 2-phenoxyethyl methacrylate, cyclohexyl methacrylate and isobornyl methacrylate.

For example, 2,3-epoxypropyl methacrylate, 3,4-epoxy-1-butene, 1-allyloxy-2,3-epoxypropane, 4-vinyl-1-cyclohexene 1,2-epoxide and 3,4-epoxycyclohexylmethyl (meth)acrylate are used for the glycidylation of the free acid groups. 2,3-Epoxypropyl methacrylate, 3,4-epoxycyclohexylmethyl (meth)acrylate and 4-vinyl-1-cyclohexene 1,2-epoxides are particularly preferred.

Particularly preferred reaction products according to the invention have the following structural elements:

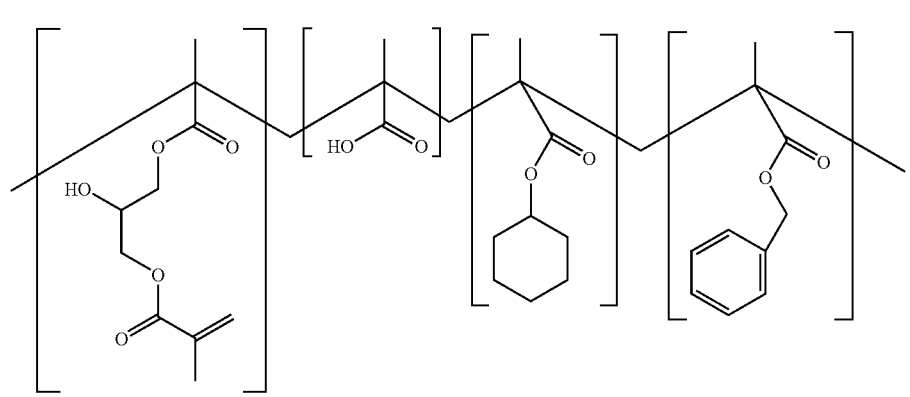
(100)
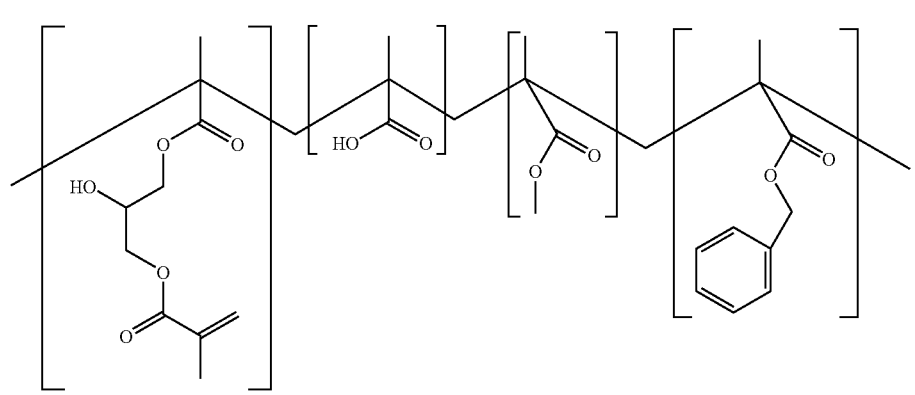
(101)
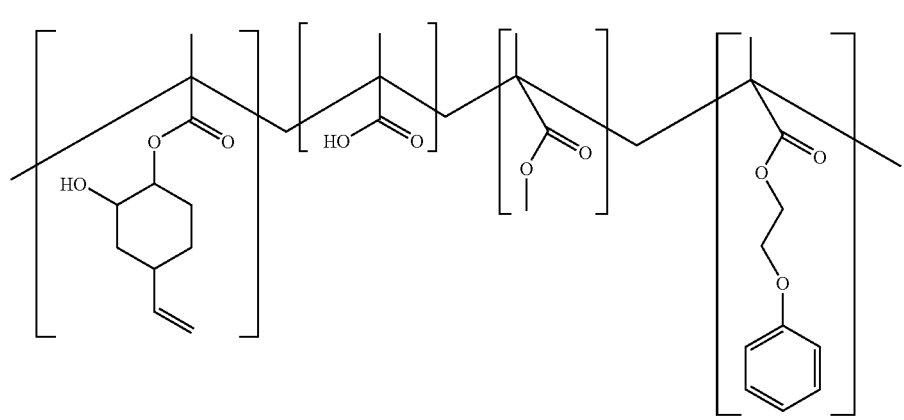
(102)
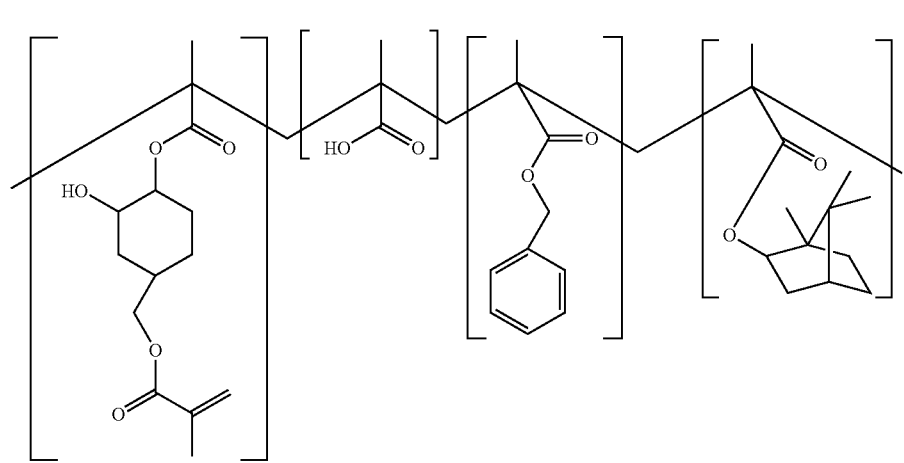
(103)

The invention furthermore provides a photopolymerizable composition, substantially comprising i) a reaction product according to the invention, as described above,
ii) if desired, a monomeric or oligomeric acrylate having at least two ethylenically unsaturated, terminal groups,
iii) a polymerization initiator system which produces free radicals, cations or anions, can be activated by actinic radiation and may additionally contain one or more sensitizers, and,
iv) if desired, an organic or inorganic filler.

Typically, the amount of component (i) is 15-70 percent by weight.

The photopolymerizable compositions according to the invention comprise (ii) a monomeric or oligomeric acrylate having at least two ethylenically unsaturated, terminal groups, it being possible for said compositions also to comprise a mixture of two or more acrylates.

For example, suitable acrylate compounds (ii) are the diacrylate and dimethacrylate esters of aliphatic or cycloaliphatic diols, such as 1,3-butylene glycol, 1,4-butanediol, neopentylglycol, 1,6-hexanediol, diethylene glycol, triethylene glycol, tetraethylene glycol, polyethylene glycol 400, polyethylene glycol 600, tripropylene glycol, ethoxylated or propoxylated neopentylglycol, 1,4-dihydroxymethylcyclohexane, 2,2-bis(4-hydroxycyclohexyl)propane or bis(4-hydroxycyclohexyl)methane.

For example, the following can be used as polyfunctional acrylates in the photopolymerizable composition according to the invention: 1,1,1-trimethylpropane triacrylate or methacrylate, ethoxylated 1,1,1-trimethylolpropane triacrylate or methacrylate, pentaerythrityl tetraacrylate, pentaerythrityl monohydroxy triacrylate or methacrylate, dipentaerythrityl monohydroxy triacrylate or methacrylate. Such compounds are known and some of them are commercially available, for example under the product names SR-295, SR-350, SR-351, SR-367, SR-399, SR-444 and SR-454 from Sartomer Company (USA).

The di(meth)acrylates based on bisphenol A and bisphenol F or the di(meth)acrylates of alkoxylated, preferably ethoxylated or propoxylated, bisphenol A or bisphenol F are preferably used as aromatic di(meth)acrylates for the photopolymerizable composition according to the invention. Such monomeric or oligomeric di(meth)acrylates are likewise known and some of them are commercially available, for example under the product name SR-348 for ethoxylated bisphenol A dimethacrylate and under the product name SR-349 for ethoxylated bisphenol A diacrylate, from Sartomer Company (USA).

Urethane (meth)acrylates which may be contained in the photopolymerizable composition according to the invention are likewise known to a person skilled in the art and can be prepared in a known manner by reacting, for example, a hydroxyl-terminated polyurethane with acrylic acid or methacrylic acid to give the corresponding urethane (meth)acrylate, or by reacting an isocyanate-terminated prepolymer with hydroxyalkyl(meth)acrylate to give the corresponding urethane (meth)acrylate. Such preparation processes are disclosed, for example, in the published Patent Applications EP114982 and EP133908.

The photopolymerizable composition according to the invention preferably contains, as component (ii), an aliphatic acrylate, a cycloaliphatic acrylate and, if desired, a urethane acrylate.

Typically, the amount of component (ii) is 0-30 percent by weight.

The photopolymerizable compositions according to the invention contain (iii) a photopolymerization initiator system comprising one or more photoinitiators, which, if desired, can contain one or more sensitizers so that the curing of the composition can preferably be initiated by UV/VIS exposure. Typical examples of a photopolymerization initiator system are benzoins, benzoin ethers, such as benzoin, benzoin methyl ether, benzoin ethyl ether and benzoin isopropyl ether, benzoin phenyl ether and benzoin acetate, acetophenones, such as acetophenone, 2,2-dimethylacetophenone and 1,1-dichloroacetophenone, benzil, benzil ketals, such as benzil dimethyl ketal and benzil diethyl ketal, and 2-methy-1-(4 methylthiophenyl)-2-morpholino-1-propanones, which are commercially available under the name Irgacure® from Ciba Spezialitätenchemie (Switzerland), anthraquinones, such as 2-methylanthraquinone, 2-ethylanthraquinone, 2-tert-butylanthraquinone, 1-chloroanthraquinone and 2-amylanthraquinone, triphenylphosphine, benzoylphosphine oxide (Luzirin TPO, BASF), benzophenones, such as benzophenone and 4,4'-bis(N,N'-dimethylamino)benzophenone, thioxanthones and xanthones, acridine derivatives, phenazine derivatives, quinoxaline derivatives or 1-phenyl-1,2-propandione 2-O-benzoyloxime, 1-aminophenyl ketones or 1-hydroxyphenyl ketones, such as 1-hydroxycyclohexyl phenyl ketone, phenyl 1-hydroxyisopropyl ketone and 4-isopropylphenyl 1-hydroxyisopropyl ketone, and 2-benzyl-2,2-dimethylamino-1-(4-N-morpholinophenyl)-1-butanone, which are known compounds and in some cases are commercially available. These compounds may be contained individually or in combination in the composition according to the invention. A combination of different photopolymerization initiators and sensitizers, having different reactivities with respect to radiation of different wavelengths, permit, for example, better utilization of a UV/VIS light source which emits emission lines of different wavelengths.

In particular, the photoinitiators commercially available under the name Irgacure®, such as benzil dimethyl ketal, benzil diethyl ketal, 2-benzyl-2,2-dimethylamino-1-(4-N-morpholinophenyl)-1-butanone and 2-methyl-1-(4-methylthiophenyl)-2-morpholino-1-propanones, are used in particular as photopolymerization initiator (iii).

The photopolymerization initiator is preferably present in an amount of from 0.1 to 15 percent by weight, based on the composition according to the invention.

Furthermore, a photopolymerization accelerator in combination with the photopolymerization initiator may be added to the composition according to the intention. The photopolymerization accelerators accelerate the polymerization reaction. Typical examples are tertiary amines, such as triethylamine, triethanolamine, 2-dimethylaminoethanol and the like.

The composition according to the invention may furthermore contain fillers, such as, for example, fillers of a water-compatible, organic and inorganic nature, in amounts of from 0 to 60% by weight, such a talc, quartz ($SiO_2$), barium sulfate ($BaSO_4$), alumina and calcium carbonates.

Furthermore, the composition according to the invention may contain organic solvents. The solvents are preferably selected from the group consisting of the ketones, such as methyl ethyl ketone, cyclohexanone and the like; aromatic hydrocarbons, such as toluene, xylene, tetramethylbenzene and the like; glycol ethers, such as methylcellosolve, butylcellosolve, methylcarbitol, butylcarbitol, propylene glycol monomethyl other, dipropylene glycol monoethyl ether, dipropylene glycol monomethyl ether, triethylene glycol monoethyl ether and the like; esters, such as ethyl acetate, butyl acetate, methoxypropyl acetate, diethylene glycol ether acetate, acetates of the abovementioned glycol ethers and the like; alcohols, such as diacetone alcohol, ethanol, propanol, methoxypropanol, ethylene glycol, propylene glycol and the like; aliphatic hydrocarbons, such as octane, decanes and the like; and petroleum solvents, such as petroleum ether, petroleum naphtha, hydrogenated petroleum naphtha, naphtha solvents and the like. These organic solvents serve for reducing the viscosity of the composition according to the invention, which leads to an improvement in its application properties.

The composition according to the invention can moreover contain additives, such as additional polymers, oligomers or monomers, which, for example, promote thermal curing of a solder mask, dyes (pigments), thickeners, antifoams, leveling agents, thermal polymerization inhibitors or antioxidants. Possible additives which promote thermal curing are solid or liquid monomeric, oligomeric or polymeric compounds which contain at least 2 free epoxide groups such as triglycidyl isocyanurate, bisphenol A or F or S epoxy resins, bisphenol A novolac type epoxide resins (phenol novolac type, o-cresol novolac type, p-t-butylphenol novolac type). Possible dyes (pigments) are phthalocyanine blue, phthalocyanine green, iodine green, disazo yellow, crystal violet, titanium oxide, carbon black, naphthalene black and the like. Suitable thickeners are, for example, Orben, Penton, montmorillonite and the like. Suitable antifoams are, for example, fluorosilicone-type, fluoride-type or polymer-type antifoams. Possible thermal polymerization inhibitors are hydroquinone, hydroquinone monomethyl ether, tert-butyl-catechol, pyrogallol, phenothiazine and the like.

The present invention thus furthermore provides photopolymerizable compositions, substantially comprising
i) a reaction product as described above,
ii) if desired, a monomeric or oligomeric acrylate having at least two ethylenically unsaturated, terminal groups,
iii) a polymerization initiator or initiator system which produces free radicals, cations or anions and can be activated by actinic radiation,
iv) if desired, an organic or inorganic filler,
v) a thermal polymerization inhibitor and
vi) a solvent or solvent system.

The present invention furthermore provides a photopolymerizable composition, substantially comprising
i) 15-70% by weight of the reaction product as described above,
ii) 0-30% by weight of monomeric or oligomeric acrylate having at least two ethylenically unsaturated, terminal groups,
iii) 0.1-15% by weight of a polymerization initiator or initiator system which produces free radicals, cations or anions and can be activated by actinic radiation,
iv) 0-60% by weight of an organic or inorganic filler,
v) 0.01-0.5% by weight of a thermal polymerization inhibitor and
vi) 20-80% by weight of a solvent or solvent system,
the percentages of the components being based on the total weight, with the proviso that the sum of the percentages by weight is 100.

The photopolymerizable compositions according to the invention are prepared, for example, by mixing the components either with stirring at, if required, temperatures up to about 60° C. or by mixing in situ on a substrate surface in, for example, inkjet printing processes.

The photopolymerizable compositions according to the invention are used especially as photoresist systems which serve in particular for the structuring and permanent coating of metallic surface. The compositions according to the invention may serve, for example, as primary, resists or as solder masks for the production of circuit boards. The coating can be applied to the substrate, especially to a cleaned plate coated in general with copper, by any known method with exclusion of light having the absorption wavelength of the photoinitiator system. Examples of such coating methods are spin-coating, screen printing, brushing on, spraying on, e.g. electrostatic spraying, roller coating, dip coating and knife coating, inkjet printing and the curtain coating method. The amount applied is dependent on the application. A combination of a plurality of coating methods may be necessary in order to obtain the required layer thickness and uniformity of the coating. The compositions according to the invention can be applied in the range from 0.1 μm to several 100 μm. Thereafter, the coating is dried for from about 1 to 60 minutes in the air and then at from about 3 to 30 minutes at 60°-120° C. The coating can also be dried directly without air drying in an oven or by IR radiation.

A) Etch Resist

After the drying, the photoresist coating is exposed through, for example, a photomask or directly to a laser and then developed, for example, with an aqueous alkaline developer solution (e.g. 0.3-3% of sodium carbonate solution) or an organic solvent (e.g. butyldiglycol, ethyldiglycol or ?-butyrolactone). The unexposed, noncrosslinked parts of the coating are thus removed. The metal (in general copper) is then removed from these unexposed parts of the substrate by means of an etching solution, with the result that defined structures are obtained. The remaining photoresist is then removed by a stripping solution, e.g. a 2-5% strength sodium hydroxide solution, if required at elevated temperature.

B) Permanent Coating

After the drying, the photoresist coating is exposed through, for example, a photomask or directly to a laser and then developed, for example, with an aqueous alkaline developer solution (e.g. 0.3-3% of sodium carbonate solution) or an organic solvent (e.g. butyldiglycol, ethyldiglycol or ?-butyrolactone). The unexposed, noncrosslinked parts of the coating are thus removed, and the exposed image parts are then, if required, heated for up to 3 hours in the temperature range 120-200° C. in order to effect postcuring of the coating.

The coating of the composition according to the invention is generally effected by means of actinic radiation or, in the case of application by means of an inkjet printer, can, if desired, be completely dispensed with. All radiation sources known per se, for example high pressure mercury lamps or UV/VIS lasers, can be used for the irradiation. These produce, as a rule, UV and/or VIS radiation, preferably having a wavelength of from about 220 to 550 nm, especially from 220 to 450 nm. The process parameters, such as, for example, duration of irradiation and distance from radiation source and radiation-sensitive layer, are generally dependent on the type of radiation-sensitive composition and on the desired properties of the coating and can be determined by a person skilled in the art by means of preliminary experiments. The imagewise exposure can be effected, for example, through a photomask or by direct writing with a laser beam on the radiation-sensitive layer.

The compositions according to the invention can also be applied to a substrate by means of an inkjet process, as described in more detail, for example, in U.S. Pat. No. 5,738, 916, U.S. Pat. No. 6,040,002 and WO02/01929. If desired, prior mixing of the components can be dispensed with here and the individual components or component combinations can be applied to the substrate through various pressure channels.

A generally uniform exposure can be followed by either the steps of etching and stripping or thermal curing, with the result that an etch resist or a permanent coating is realized without passing through a development step. The exposure dose used can generally be substantially lower than in the case of conventional photomask exposure or, depending on the polymer composition, may also be completely dispensed with.

The present invention provides a process for producing an etch resist image or solder resist image, comprising the process steps:
I. Application of the photopolymerizable composition according to the invention to a substrate;
II. removal of the solvent from the applied composition with formation of a film of the photopolymerizable composition on the substrate;
III. if desired, exposure of the coated substrate to actinic radiation;
IV. if desired, removal of the unexposed parts of the coating with the aid of an alkaline aqueous or organic solvent with baring of the substrate; and
V. if desired, thermal curing and, if desired, UV curing of the coating remaining on the substrate.

Also preferred is a process for producing an etch resist image or solder resist image, comprising the process steps:
I. Application of the photopolymerizable composition according to the invention to a substrate by means of an inkjet method;
II. removal of the solvent from the applied composition with formation of a dried photopolymerizable composition on the substrate;
III. if desired, uniform exposure of the coated or structured substrate to actinic radiation; and
IV. if desired, thermal curing and, if desired, UV curing of the coating remaining on the substrate.

In addition to use in processes for the production of circuit boards, the reaction products according to the invention can also be used in processes for the production of printing plates (as described, for example, in U.S. Pat. No. 4,361,640, in particular column 4, line 67, to column 7, line 68) and for the production of LCD displays (as described, for example, in U.S. Pat. No. 5,925,484).

The present invention furthermore provides a photopolymerizable element comprising a substrate which carries a photopolymerizable layer, substantially comprising
A) 25-85% by weight of the reaction product according to the invention, as described above;
B) 5-40% by weight of monomeric or oligomeric acrylate having at least two ethylenically unsaturated, terminal groups;
C) 1-25% by weight of an addition polymerization initiator or initiator system which produces free radicals, cations or anions and can be activated by actinic radiation;
D) 0-60% by weight of an organic or inorganic filler and
E) 0.025-1.0% by weight of a thermal polymerization inhibitor;
the percentages of the components being based on the total weight, with the proviso that the sum of the percentages by weight is 100,
having a thickness of 0.1-400 µm.

A layer thickness of 3-50 µm is preferred.

The following examples illustrate the invention further.
The abbreviations used have the following meaning:0

| MAA | Methacrylic acid |
| MMA | Methyl methacrylate |

-continued

| BzMA | Benzyl methacrylate |
| MAGMA | Methacryloyloxy-2-hydroxypropyl methacrylate |
| MGIP | Methacryloyloxy-2-hydroxypropyl isopropyl ether |
| MPA=PMA | Methoxypropylacetic ester |
| MP | Methoxypropanol |
| Cr-Hex-CEM | Chromium(III) 2-ethylhexanoate |
| TMPTA | Trimethylolpropane triacrylate (Cray Valley) |
| Ebecryl 160 | Poly[oxy-1,2-ethanediyl, alpha, hydro-omega-[(1-oxo-2-propenyl)oxy]] ether and 2-ethyl-2 (hydroxymethyl)-1,3-propanediol (3:1), (UCB) |
| Irgacure 907 | 2-Methyl-1-(4-methylthio)phenyl-2-morpholino-1-propanone (Ciba) |
| Orasolblau GN | Phthalocyanine dye, Ciba |
| Quantacure ITX | 2,4-isopropylthioxanthone, Rahn |
| Silbond FW 600AST | $SiO_2$, Quartzwerk Frechen |
| Dyhard UR 200 | Substituted aromatic urea, (Rahn) |
| Tego 900 | Polysiloxane (Tego) |
| Syloid161 | Amorphous silica, $SiO_2$, (Grace) |
| DER 331 | Bisphenol A epoxy resin, (Dow) |
| Lionol Green 2Y-301 | Phthalocyanine dye, (Toyo) |

SYNTHESIS EXAMPLES

Synthesis Example 1

10% of a thoroughly mixed solution comprising 35 parts by weight of methyl methacrylate, 35 parts by weight of benzyl methacrylate and 30 parts by weight of methacrylic acid are introduced into a reactor into which 200 ml of the solvent mixture MPA/MP (70:30) has initially been introduced. 100 ml of MPA/MP and 2 parts by weight of 2,2'-azobis(2-methylbutyronitrile) are added to the remaining monomer solution. The initially introduced mixture in the reactor is heated to 90° and the thoroughly mixed monomer/initiator solution is added dropwise over a period of 2 hours to the initially introduced mixture in the reactor under nitrogen. After the end of the addition of the monomer mixture, the reaction solution is allowed to react for a further 5 hours at 90° C. and then for 1 hour at 135° C.

Thereafter, the reaction is cooled to 90° C. and air is passed in below the reaction surface. After the addition of 0.2 percent by weight of di-tert-butyl-p-cresol and 0.2 percent by weight of Cr-Hex-CEM, 12.4 parts by weight of glycidyl methacrylate are added dropwise over a period of 40 minutes. After the end of the addition, the reaction solution is allowed to react for a further 10 minutes at 90° C. The polymer solutions thus obtained are characterized by acid titration, epoxide titration, GPC and analysis of solids.

TABLE 1

Functionalized resins

| | Resin 1 | Resin 2 | Resin 3 | Resin 4 |
|---|---|---|---|---|
| Monomer A | MAGMA | MAGMA | MAGMA | MAGMA |
| parts by weight | 7.5 | 9 | 7.5 | 9.99 |
| Monomer B | MAA | MAA | MAA | MAA |
| parts by weight | 22.5 | 21 | 22.5 | 23.33 |
| Monomer C | MMA | | MMA | MMA |
| parts by weight | 35 | | 25 | 44.44 |
| Monomer D | BzMA | BzMA | BzMA | BzMA |
| parts by weight | 35 | 70 | 45 | 22.22 |
| Molecular weight (g/mol) (weight average) | 50 000 | 51400 | 26000 | 62000 |
| Acid number (mol/kg) | 1.0 | 1.0 | 1.0 | 1.2 |
| Molecular weight (number average) (g/mol) | 9 000 | 5200 | 3000 | 4100 |

Comparative Synthesis Example 2

Nonfunctionalized Resin

The resins are synthesized as described under synthesis example 1, but the reaction with glycidyl methacrylate is omitted.

TABLE 2

| Nonfunctionalized resins | |
|---|---|
| | Resin 1/1 |
| Monomer B | MAA |
| parts by weight | 30 |
| Monomer C | MMA |
| parts by weight | 35 |
| Monomer D | BzMA |
| parts by weight | 35 |
| Molecular weight (g/mol) (weight average) | 37800 |
| Acid number (mol/kg) | 1.4 |
| Molecular weight (number average) (g/mol) | 4600 |

FORMULATION EXAMPLES

Formulation Example 1

The constituents shown in the table are mixed, processed with a Dispermat (2000 rpm, 60° C., 30 min) to give a homogeneous solution and filtered (pore size of the filter: 2).

TABLE 3

| Formulations for a liquid etch resist | | | | |
|---|---|---|---|---|
| | Formulation A (parts by weight) | Formulation B (parts by weight) | Formulation C (parts by weight) | Formulation D (parts by weight) |
| Resin 1 (35%) | 74.6 | | | |
| Resin 2 (35%) | | 74.66 | | |
| Resin 3 (35%) | | | 74.66 | |
| Resin 4 (35%) | | | | 74.66 |
| TMPTA | 2.96 | 2.96 | 2.96 | 2.96 |
| Irgacure 907 | 2.52 | 2.52 | 2.52 | 2.52 |
| Benzotriazole | 0.28 | 0.28 | 0.28 | 0.28 |
| Ebecryl 160 | 6.76 | 6.76 | 6.76 | 6.76 |
| Orasolblau GN | 0.05 | 0.05 | 0.05 | 0.05 |
| Tego 900 | 0.05 | 0.05 | 0.05 | 0.05 |
| 2/4-isopropylthioxanthone | 1.26 | 1.26 | 1.26 | 1.26 |
| 2,6-di-tert-butyl-p-cresol | 0.02 | 0.02 | 0.02 | 0.02 |
| PMA | 11.5 | 11.5 | 11.5 | 11.5 |
| Total | 100 | 100 | 100 | 100 |

Formulation Example 2

The constituents of the two components which are shown in the table are mixed and are milled by means of a three-roll mill to give a homogeneous material. The process is repeated three times so that the particle size of the largest solid constituents of the prepared formulation is not greater than 3 μm. Resin component and curing agent component are mixed in the stated ratio immediately before the application.

TABLE 4

| Formulations for solder mask application | |
|---|---|
| | Formulation E (parts by weight) |
| Resin | |
| Resin 4 (35%) | 56.7 |
| MPA | 3.4 |
| Irgacure 907 | 3.37 |
| Quantacure ITX | 1.22 |
| Silbond FW 600AST | 15.1 |
| Benzotriazole | 0.03 |
| Dicyandiamide | 0.04 |
| Dyhard UR 200 | 0.26 |
| Tego 900 | 0.09 |
| Syloid 161 | 3.85 |
| Resin component | 84.06 |
| Curing agent | |
| Ebecryl 160 | 7.34 |
| PMA | 3.29 |
| Hydroquinone | 0.002 |
| DER 331 | 5.37 |
| Lionol Green 2Y-301 | 0.36 |
| Curing agent component | 16.36 |
| Total | 100.4 |

Formulation Example 3

A functionalized unsaturated resin and a nonfunctionalized resin of the same monomer composition are used as a binder polymer in a formulation for an etch resist application. The formulations are prepared as described in formulation example 1.

TABLE 5

| Formulation for a comparative example | |
|---|---|
| | Formulation F (parts by weight) |
| Resin 1/1 (35%) | 74.66 |
| Ebecryl 270 | 2.96 |
| Irgacure 907 | 2.52 |
| Benzotriazole | 0.28 |
| Ebecryl 160 | 6.76 |
| Orasolblau GN | 0.05 |
| Tego 900 | 0.05 |
| 2/4-isopropylthioxanthone | 1.26 |
| 2,6-di-tert-butyl-p-cresol | 0.02 |
| PMA | 11.5 |
| Total | 100 |

Formulation Example 4

The constituents shown in table 6 are mixed as described in formulation example 2.

TABLE 6

Formulation for LDI solder mask application

| | Formulation G (parts by weight) |
|---|---|
| Resin | |
| Resin 4 (35%) | 51.02 |
| Irgacure 907 | 5.05 |
| Quantacure ITX | 0.67 |
| Talkum Ultramix | 1.06 |
| Silbond FW 600 AST | 15.82 |
| Syloid 161 | 1.85 |
| Benzotriazole | 0.04 |
| Dicyandiamide | 0.13 |
| Chlortoluron | 0.11 |
| Tego 900 | 0.92 |
| Ebecryl 160 | 4.63 |
| Resin component | 81.3 |
| Curing agent | |
| MPA | 2.85 |
| Ebecryl160 | 6.76 |
| Hydroquinone | 0.001 |
| DER 331 | 8.74 |
| Lionol Green 2Y-301 | 0.35 |
| Curing agent component | 18.7 |
| Total | 100.0 |

Formulation Example 5

Formulation for Inkjet-Etch Resist Application

The constituents shown in table 7 are processed to give a homogeneous solution as described in formulation example 1.

TABLE 7

Formulation for inkjet-etch resist application

| | Formulation H (parts by weight) |
|---|---|
| Resin 3 (35%) | 28.0 |
| TMPTA | 2.96 |
| Irgacure 907 | 2.52 |
| Benzotriazole | 0.28 |
| Ebecryl 160 | 6.76 |
| Orasolblau GN | 0.05 |
| 2/4-isopropylthioxanthone | 1.26 |
| 2,6-di-tert-butyl-p-cresol | 0.02 |
| MP | 58.15 |
| Total | 100 |

USE EXAMPLES

Use Example 1

Conventional Etch Resist

The formulation is applied to a copper-coated glass fiber-reinforced epoxy laminate by means of a horizontal roller coater. The coated plates are dried in a convection oven at 80° C. for 3 min and then exposed to UV light through a mask (365 nm, 120 mJ/cm$^2$). The layer thickness (9-11 μm) of the coating is measured by means of an isoscope (Fischer). Non-crosslinked parts of the coating are removed with 1% aqueous Na$_2$CO$_3$ at a spray pressure of 2.0 kg/cm$^2$ for 60 seconds. Uncoated copper of the plates is removed with etching solution (2-3 N aqueous HCl, 80-140 g of copper/l) at a spray pressure of 2 bar. A series of tests is carried out in order to determine the properties of the formulations in a liquid etch resist application. All tests are carried out in comparison with a reference formulation as internal standard.

The following tests are carried out in the case of liquid etch resist application:

1. Hardness after Drying

The formulation is applied to a copper-coated plate and predried for 5 minutes at room temperature. Thereafter, the plate is dried for 3 minutes in a convection oven at 80° C. and cooled to room temperature. The hardness of the coating is measured by determining the pencil hardness. The stated pencil hardness is based on the hardness of a pencil which, when it is moved along the surface with gentle, constant pressure at an angle of 45°, produces no possible damage to the surface. The hardnesses of the pencils used are 6B, 5B, 4B, 3B, 2B, B, HB, H, 2H and 3H, where 6B relates to the softest and 3H to the hardest pencil.

2. Hardness in the Developer

After exposure to UV light, the coated copper plate is introduced into developer solution for one minute at 30° C. The plate is removed from this bath and the pencil hardness of the wet surface is determined as described under point 1.

3. Photoreactivity of the Coating

Coated and dried plates are exposed to UV light (365 nm, 120 mJ/cm$^2$) through a mask. The photoreactivity of the coating is determined using a Stouffer sensitivity scale 21 (SSG21).

4. Resolution

Coated and dried plates are exposed to UV light (365 nm, 120 mJ/cm$^2$) through a mask. The resolution is determined using a Stouffer resolution scale (SRG).

5. Development

A coated and dried plate is introduced into a gently agitated bath containing developer solution (1% strength aqueous Na$_2$CO$_3$) at a temperature of 30° C. and the time required until the coating begins to become detached from the plate is measured.

6. Strippability

A coated, dried and exposed plate is introduced into a vigorously agitated bath containing stripping solution (4% strength aqueous NaOH) at a temperature of 45° C. and the time required until the coating begins to become detached from the plate is measured.

7. Etching

The quality of copper tracks after etching was assessed both by optical microscopy and by electron microscopy ( . . . , DSM 950, Zeiss).

Assessment Criteria:

oo . . . straight lines of constant copper thickness o . . . straight lines with slight deviations in the copper thickness x . . . wavy lines of constant copper thickness xx . . . wavy lines with slight deviations in the copper thickness

TABLE 8

Results of use example 1

| Test | Formulation A | Formulation B | Formulation C | Formulation D |
|---|---|---|---|---|
| Pencil hardness after drying | HB-B 4B | 5B 3B | 4B 2B | HB 3B |

TABLE 8-continued

Results of use example 1

| Test | Formulation A | Formulation B | Formulation C | Formulation D |
|---|---|---|---|---|
| in the developer | | | | |
| Photosensitivity (SSG) | 7-8 | 8-9 | 9-10 | 8-9 |
| Resolution SRG (mill) | <1 | <1 | <1 | <1 |
| Development speed (sec) | 40-45 | 40 | 45 | 45 |
| Stripability (sec) | 9 | 15 | 60 | 13 |
| Etching | oo | oo | o | o |

TABLE 9

Results of the comparative example

| Test | Formulation A (parts by weight) | Formulation F (parts by weight) |
|---|---|---|
| Pencil hardness | B | B |
| after drying | 4B | 6B |
| in the developer | | |
| Photosensitivity (SSG) | 8-9 | 5-7 |
| Resolution SRG (mill) | <1 | <1 |
| Development speed (sec) | 45 | 50 |
| Strippability (sec) | 20 | 5 |
| Etching | oo | oo |

Use Example 2

Conventional Solder Mask

The formulation is applied by means of a doctor blade to the surface of a copper-coated plate and dried in a convection oven at 80° C. for 20 minutes. The coated surface is exposed to UV light (365 nm, 120 mJ/cm$^2$) through a photomask. Unexposed parts of the coating are removed from the plate with 1% strength aqueous $Na_2CO_3$ solution at a spray pressure of 2 kg/cm$^2$ for 60 seconds. The coating is then thermally cured (150° C., 60 minutes).

The following tests are carried out in a solder mask application.

A. Nontacky Coating Surface after Drying

The surface coating is rated as nontacky (nt) if the photomask shows no adhesion to the surface after the exposure.

B. Photoreactivity of the Coating

Coated and dried plates are exposed to UV light (365 nm, 120 mJ/cm$^2$) through a mask. The photoreactivity of the coating is determined using a Stouffer sensitivity scale 21 (SSG21).

C. Development

Coated, dried and UV-exposed plates are developed at 0.65 m/min using 1% strength aqueous $Na_2CO_3$ solution at 30° C. under a spray pressure of 3 bar.

D. Adhesion of the Coating to the Copper Surface

Coated and dried plates are exposed to UV light (365 nm, 120 mJ/cm$^2$) through a mask. After the development, the coated surface is thermally cured for 60 minutes at 150° C. The adhesion of the cured coating to the copper surface is determined by carrying out a crosshatch test. For this purpose, the coated surface is first scratched in a defined pattern and an adhesive tape (Scotch Brand 9898) is then pressed onto the resulting pattern and removed again (adhesive tape test).

The quality of the adhesion is assessed as:
oo . . . no breaking of the edges of the coating at the corners of the scratched pattern
o . . . slight damage to the edges of the coating at the corners of the scratched pattern
x . . . severe damage to the edges of the coating at the corners of the scratched pattern
xx. the coating at the corners of the scratched pattern is completely removed E. Solvent Resistance Coated, dried, exposed, developed and thermally cured plates are incubated at room temperature for 5 minutes in $CH_2Cl_2$. The condition of the coating after the incubation is assessed by measuring the pencil hardness (cf. liquid etch resist application, 1) as follows:
oo . . . pencil hardness of the coated surface corresponds to that measured before the incubation
o . . . slight deviation of the pencil hardness after the incubation
x . . . strong deviation of the pencil hardness after the incubation
xx . . . formation of bubbles, swelling and detachment of the coating from the surface F. Resistance to Chemical Ni—Au Surface Coating Chemical Ni—Au surface coating of processed plates is carried out by standardized methods (Shipley, Atotech). Losses of adhesion of the solder mask to the copper surface are determined by carrying out an adhesive tape test (cf. D) and assessed as follows:
oo . . . no losses of adhesion
o . . . slight losses of adhesion
x . . . great losses of adhesion
xx . . . total loss of adhesion G. Resistance to Soldering Process Coated, dried, exposed, developed and thermally cured plates are first immersed in flux (25% of rosin in isopropanol). The plates are then dried for 60 seconds and immersed three times for 10 seconds each time in a soldering bath (265° C.). The condition of the coating is then assessed as follows:
oo . . . no change in the coated surface
o . . . slight change in the coated surface
x . . . strong change in the coated surface
xx . . . bubble formation, swelling and detachment of the coated surface H. Resolution Coated, and dried plates are exposed to UV light (365 nm, 120 mJ/cm$^2$) through a mask. The resolution is determined using a Stouffer resolution scale (SRG).

I. Pressure Cooker Test

Coated and dried plates are exposed to UV light (365 nm, 120 mJ/cm$^2$) through a mask and then incubated for 72 hours in a pressure cooker at 120° C. and 1.5 bar. The condition of the coated surface is then assessed as follows:
oo . . . no change in the coated surface
o . . . slight change in the coated surface
x . . . strong change in the coated surface
xx . . . bubble formation, swelling and detachment of the coated surface

TABLE 10

Results of use example 2

| Test | Formulation E |
|---|---|
| Nontacky surface | nt |
| Photosensitivity (SSG) (120 mJ/cm$^2$) | 8 |

TABLE 10-continued

Results of use example 2

| Test | Formulation E |
|---|---|
| Development (sec) | 180 |
| Adhesion to copper | o |
| Solvent resistance | oo |
| Ni—Au resistance | o |
| Resistance to soldering process | oo |
| Resolution (SRG, mill) | 1.5 |
| Pressure cooker test | oo |

Use Example 3

LDI—Solder Mask

The formulation is applied by the screen printing method to a copper-coated glass fiber-reinforced epoxy laminate (laminate 1 mm, drilled with 0.2 mm holes, 40 μm copper). After drying at 80° C. for 40 minutes, exposure is effected by means of an LDI unit (Etek) with an exposure energy of 50 mJ. The further processing of the plate is then effected as described in use example 2 (conventional solder mask application).

TABLE 11

Results of use example 3

| Test | Formulation G |
|---|---|
| Nontacky surface | nt |
| Photosensitivity (SSG) (50 mJ/cm$^2$) | 8 |
| Development (sec) | 180 |
| Adhesion to copper | o |
| Solvent resistance | oo |
| Ni—Au resistance | o |
| Resistance to soldering process | oo |
| Resolution (SRG, mill) | 1.5 |
| Pressure cooker test | oo |

Use Example 4

Inkjet—Etch Resist

The formulation is applied by means of an inkjet printing apparatus (from Stork, Mühlheim; piezo print head, 256 nozzles having a diameter of 48 μm, Spectra). Application is effected at 35° C. and a fire pulse frequency of from 2 to 8 kHz onto a precleaned copper-coated glass fiber-reinforced epoxy laminate (1.2 mm, 35 μm copper). The coated plate is then dried at 80° C. for 2 minutes, cooled and then exposed uniformly (Hg lamp, 25-30 mJ/cm$^2$) and etched as described in use example 1 (conventional etch resist). Results comparable to those described in use example 1, table 8, were obtained.

What is claimed is:

1. A reaction product comprising at least
   a) acrylic acid or methacrylic acid or a mixture of acrylic acid and methacrylic acid and
   b) a (meth)acrylic ester of substituted or unsubstituted phenol, $C_1$-$C_8$-hydroxyalkylbenzene or $C_1$-$C_8$-hydroxyalkoxybenzene and methyl(meth)acrylate in the ratio (percent by weight) of from 7.1:92.9 to 50:50,
   5-90% of the acrylic or methacrylic acid units having reacted with a glycidylvinyl compound and wherein the ratio (percent by weight) of component a) to component b) is from 80:20 to 20:80.

2. A reaction product according to claim 1, wherein component a) is methacrylic acid.

3. A reaction product according to claim 1, wherein the (meth)acrylic ester of component b) is benzyl methacrylate.

4. A reaction product according to claim 1, wherein the glycidylvinyl compound is glycidyl methacrylate.

5. A reaction product according to claim 1, wherein the molecular weight of the reaction product is 10000-120000 g/mol.

6. A reaction product according to claim 1, wherein the molecular weight of the reaction product is 20000-90000 g/mol.

7. A reaction product according to claim 1, which has an acid number of 0.4-5.0 mol/kg, referred to the reaction product.

8. A photopolymerizable composition, substantially comprising
   i) a reaction product according to claim 1,
   ii) a monomeric or oligomeric acrylate having at least two ethylenically unsaturated, terminal groups,
   iii) a polymerization initiator or initiator system which produces free radicals, cations or anions and can be activated by actinic radiation and,
   iv) if desired, an organic or inorganic filler.

9. A photopolymerizable composition, substantially comprising
   i) 15-70% by weight of the reaction product according to claim 1,
   ii) 0-30% by weight of monomeric or oligomeric acrylate having at least two ethylenically unsaturated, terminal groups,
   iii) 0.1-15% by weight of a polymerization initiator or initiator system which produces free radicals, cations or anions and can be activated by actinic radiation,
   iv) 0-60% by weight of an organic or inorganic filler,
   v) 0.01-0.5% by weight of a thermal polymerization inhibitor and
   vi) 20-80% by weight of a solvent or solvent system,
   the percentages of the components being based on the total weight, with the proviso that the sum of the percentages by weight is 100.

10. A photopolymerizable composition, substantially comprising
    i) a reaction product according to claim 1,
    ii) if desired, a monomeric or oligomeric acrylate having at least two ethylenically unsaturated, terminal groups,
    iii) a polymerization initiator or initiator system which produces free radicals, cations, or anions, and can be activated by actinic radiation,
    iv) if desired, an organic or inorganic filler,
    v) a thermal polymerization inhibitor and
    vi) a solvent or solvent system.

11. A process for producing an etch resist image or solder resist image, comprising the process steps:
    I. Application of a photopolymerizable composition according to claim 10 to a substrate by means of an inkjet method;
    II. removal of the solvent from the applied composition with formation of a dried photopolymerizable composition on the substrate;
    III. if desired, uniform exposure of the coated or structured substrate to actinic radiation; and
    IV. if desired, thermal curing and, if desired, UV curing of the coating remaining on the substrate.

12. A process for producing an etch resist image or solder resist image, comprising the process steps of:

I. Application of a photopolymerizable composition according to claim 10 to a substrate;

II. removal of the solvent from the applied composition with formation of a film of the photopolymerizable composition on the substrate;

III. if desired, exposure of the coated substrate to actinic radiation;

IV. if desired, removal of the unexposed parts of the coating with the aid of an alkaline-aqueous or organic solvent with baring of the substrate; and V. if desired, thermal curing and, if desired, UV curing of the coating remaining on the substrate.

13. A process according to claim 12, wherein the exposure (III) is effected with the aid of a photomask or directly by means of a laser.

14. A photopolymerizable element comprising a substrate which carries a photopolymerizable layer, substantially comprising A) 25-85% by weight of the reaction product according to claim 1, B) 5-40% by weight of monomeric or oligomeric acrylate having at least two ethylenically unsaturated, terminal groups;

C) 1-25% by weight of an addition polymerization initiator or initiator system which produces free radicals, cations, or anions and can be activated by actinic radiation;

D) 0-60% by weight of an organic or inorganic filler and

E) 0.025-1.0% by weight of a thermal polymerization inhibitor;

the percentages of the components being based on the total weight, with the proviso that the sum of the percentages by weight is 100.

15. A photopolymerizable element according to claim 14, wherein the thickness of the photopolymerizable layer is 3-50 μm.

\* \* \* \* \*